US008750069B2

(12) United States Patent
Kim

(10) Patent No.: US 8,750,069 B2
(45) Date of Patent: Jun. 10, 2014

(54) SEMICONDUCTOR DEVICE AND METHOD FOR FORMING THE SAME

(71) Applicant: SK Hynix Inc., Icheon (KR)

(72) Inventor: Jung Sam Kim, Seoul (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/155,289

(22) Filed: Jan. 14, 2014

(65) Prior Publication Data

US 2014/0124892 A1 May 8, 2014

Related U.S. Application Data

(62) Division of application No. 13/347,527, filed on Jan. 10, 2012.

(30) Foreign Application Priority Data

Oct. 24, 2011 (KR) .......................... 10-2011-0108821

(51) Int. Cl.
| G11C 17/18 | (2006.01) |
| G11C 17/14 | (2006.01) |
| G11C 17/16 | (2006.01) |
| H01L 21/768 | (2006.01) |
| H01L 27/06 | (2006.01) |

(52) U.S. Cl.
CPC .............. *G11C 17/14* (2013.01); *G11C 17/16* (2013.01); *H01L 21/76897* (2013.01); *H01L 21/768* (2013.01); *H01L 27/0688* (2013.01); *H01L 2224/321* (2013.01)

USPC .......................................... 365/225.7; 365/63

(58) Field of Classification Search
CPC ....... G11C 17/14; G11C 17/16; H01L 21/768; H01L 21/6897; H01L 27/0688; H01L 2224/321; H01L 2924/10253
USPC .................................................. 365/225.7, 63
See application file for complete search history.

(56) References Cited

U.S. PATENT DOCUMENTS

| 5,741,720 A | * | 4/1998 | Hawley et al. ................ 438/467 |
| 5,807,786 A | * | 9/1998 | Chang ............................ 438/600 |
| 6,265,257 B1 | * | 7/2001 | Hsu et al. ...................... 438/215 |
| 7,572,682 B2 | * | 8/2009 | Yang et al. .................... 438/131 |
| 8,421,186 B2 | * | 4/2013 | Li et al. ......................... 257/529 |
| 8,610,243 B2 | * | 12/2013 | Poppe et al. .................. 257/529 |

FOREIGN PATENT DOCUMENTS

KR       10-2011-0067363       7/2011

* cited by examiner

*Primary Examiner* — Viet Q Nguyen

(57) ABSTRACT

A method for forming a semiconductor device is disclosed. An anti-fuse is formed at a buried bit line such that the area occupied by the anti-fuse is smaller than that of a conventional planar-gate-type anti-fuse, and a breakdown efficiency of an insulation film is increased. This results in an increase in reliability and stability of the semiconductor device. A semiconductor device includes a line pattern formed over a semiconductor substrate, a device isolation film formed at a center part of the line pattern, a contact part formed at both sides of the line pattern, configured to include an oxide film formed over the line pattern, and a bit line formed at a bottom part between the line patterns, and connected to the contact part.

5 Claims, 10 Drawing Sheets

Cell Array

SEMICONDUCTOR DEVICE AND METHOD FOR FORMING THE SAME

CROSS-REFERENCE TO RELATED APPLICATION

The present application is a divisional application of U.S. patent application Ser. No. 13/347,527, filed on Jan. 10, 2012, which claims the priority of Korean Patent Application No. 10-2011-0108821 filed on 24 Oct. 2011, the disclosures of which are hereby incorporated in their entirety by reference.

BACKGROUND OF THE INVENTION

Embodiments of the present invention relate to a method for forming a semiconductor device, and more particularly to an anti-fuse for a semiconductor device included in a vertical gate, and a method for forming the same.

Semiconductor devices cannot be used as memory devices when a defect or failure occurs in at least one unit cell therein during a fabrication process. The memory device having at least one failed unit cell is classified as a defective product, and results in decreased production efficiency. Therefore, a technology has been introduced for substituting a defective cell with a redundancy cell included in a memory device so as to restore the memory device, which increases the production yield and reduces production costs.

A repair task of substituting the defective cell with the redundancy cell is designed to use a redundancy row and/or a redundancy column formed in every cell array, such that the row or column including the defective memory cell is replaced with the redundancy row or redundancy column. For example, if a defective cell is detected in a test process after the fabrication process is finished, a program operation for making access to a redundancy cell with an address input to access to the defective cell is carried out in an internal circuit of the memory device. Therefore, if an address signal corresponding to a defective line used to select the defective cell is input to the memory device, a redundancy line used to select the redundancy cell is accessed instead of the defective line.

A typical repair process is designed to use a fuse. However, since the method for repairing a semiconductor device using a fuse performs the repair process on a wafer level, it cannot be applied to a packaged semiconductor device. Therefore, a new method to overcome the limitations of the above-mentioned repair method using an anti-fuse is introduced.

The method using the anti-fuse can perform a program capable of easily repairing a defective cell, even if it is included in the packaged memory device. The anti-fuse performs the opposite function to the fuse. That is, the anti-fuse starts with a high resistance and is designed to create an electrically conductive path, whereas the fuse starts with a low resistance and is designed to break an electrically conductive path. Generally, the anti-fuse is formed with a very thin dielectric material of a non-conducting amorphous material, e.g., $SiO_2$, silicon nitride, tantalum oxide, or ONO (silicon dioxide-silicon nitride-silicon dioxide) between two electrical conductors.

In accordance with a programming operation of the anti-fuse, a predetermined voltage is applied to the anti-fuse during a sufficient period of time such that the dielectric material located between two conductors is broken down. Therefore, the two electrical conductors of the anti-fuse are in short-circuit, such that the anti-fuse has very low resistance. Accordingly, the anti-fuse becomes electrically closed in a basic status.

For example, the anti-fuse includes a gate formed over a gate insulation film, a contact plug spaced apart from the gate by a predetermined distance by a dielectric thin film, and a conductive line coupled to the contact plug. Generally, the anti-fuse is designed to operate by breakdown of the dielectric thin film by applying a high voltage to the contact plug.

However, when the dielectric thin film located at the edge of the active region is broken down, the gate insulation film between the semiconductor substrate and the gate is also ruptured. As a result, threshold voltage changes, and thus device reliability deteriorates.

In addition, when a size of a gate (for example, gate width or length) is increased so as to enhance reliability and stability of the anti-fuse, the area occupied by the anti-fuse increases in proportion to the gate size. As a result, the area occupied by the anti-fuse is increased in the entire chip area, resulting in reduction in productivity.

Moreover, the gate insulation film can be broken down between the gate and the semiconductor substrate, the gate and the semiconductor are short-circuited by breakdown of the gate insulation film, and thus reliability and stability of a device deteriorated.

BRIEF SUMMARY OF THE INVENTION

Various embodiments of the present invention are directed to providing a method for forming a semiconductor device that substantially obviates one or more problems due to limitations and disadvantages of the related art.

Embodiments of the present invention relate to a method for forming a semiconductor device which avoids reducing productivity of net dies, although the area occupied by an anti-fuse is increased to improve reliability and stability of the anti-fuse. Moreover, a gate and the semiconductor substrate are not short-circuited because a gate insulation film located at the overlapping region of the gate and the semiconductor substrate is prevented from being broken down.

In accordance with one embodiment of the present invention, a semiconductor device includes a line pattern formed over a semiconductor substrate; a device isolation film formed at a center part of the line pattern; a contact part formed at both sides of the line pattern, configured to include an oxide film formed over the line pattern; and a bit line formed at a bottom part between the line patterns, and connected to the contact part.

The device isolation film may be a laminate structure of a device isolation film and a capping film. The device isolation film may include an oxide film, and the capping film includes a nitride film.

The semiconductor device may further include a junction region formed at both sides of the line pattern, and connected to a sidewall contact. The junction region may include n-type impurity ions.

The bit line may include doped polysilicon. The oxide film may be formed to have a thickness of 20 Å~25 Å.

The oxide film may be ruptured by a bias voltage applied to the bit line. The oxide film is ruptured in an overlapping region between the bit line and the junction region.

In accordance with another embodiment of the present invention, a method for forming a semiconductor device includes forming a line pattern over a semiconductor substrate; forming a trench by etching a center part of the line pattern; forming a device isolation film by burying an insulation film into the trench; forming a sidewall contact at both sides of the line pattern; forming an oxide film over the line pattern of the sidewall contact; and forming a bit line coupled to the sidewall contact at a part between the line patterns.

The forming of the device isolation film may include forming a device-isolation insulation film over the line pattern including the trench; etching the device-isolation insulation film until a top part of the line pattern is exposed; and forming a capping film over the device-isolation insulation film.

The forming of the sidewall contact may include forming a buried polysilicon layer at a bottom part between the line patterns; forming a liner nitride film over the line pattern exposed by the buried polysilicon layer; exposing the line pattern of a lower part of the liner nitride film by further etching the buried polysilicon layer; and removing the buried polysilicon layer.

The method may further include, after the formation of the sidewall contact, forming a junction region at both sides of the line pattern through the sidewall contact.

The forming of the junction region may include forming the junction region by implanting n-type impurity ions through the sidewall contact.

In the formation of the oxide film, the oxide film may be formed to have a thickness of 20 Å~25 Å. The forming of the bit line further may include forming a doped polysilicon layer over the entirety of the semiconductor substrate including the line pattern; and etching the doped polysilicon layer in such a manner that the doped polysilicon layer remains only in a bottom part between the line patterns.

The oxide film may be ruptured by a bias voltage applied to the bit line and a junction region. The oxide film may be ruptured in an overlapping region between the bit line and a junction region.

In accordance with another embodiment of the present invention, a memory cell includes a transistor including a gate and a gate junction region; a storage unit coupled to the gate junction region; a contact part formed at both sides of a line pattern whose center part includes a device isolation film, configured to include an oxide film formed over the line pattern; and a bit line formed at a bottom part between the line patterns, and connected to the contact part.

The oxide film may be ruptured by a bias voltage applied to the bit line. The storage unit may be a capacitor. The gate may be a vertical gate.

In accordance with another embodiment of the present invention, a memory cell array includes one or more memory cells. Each memory cell includes a transistor including a gate and a gate junction region; a storage unit coupled to the gate junction region; a contact part formed at both sides of a line pattern whose center part includes a device isolation film, configured to include an oxide film formed over the line pattern; and a bit line formed at a bottom part between the line patterns, and connected to the contact part.

The oxide film may be ruptured by a bias voltage applied to the bit line.

In accordance with another embodiment of the present invention, a memory device includes a core circuit region; and a memory cell array. The memory cell array includes a transistor including a gate and a gate junction region, a storage unit coupled to the gate junction region, a contact part formed at both sides of a line pattern whose center part includes a device isolation film, configured to include an oxide film formed over the line pattern, and a bit line formed at a bottom part between the line patterns, and connected to the contact part.

The core circuit region may include a row decoder for selecting one word line from among word lines of the memory cell array; a column decoder for selecting one bit line from among bit lines of the memory cell array; and a sense amplifier for sensing data stored in a memory cell selected by the row decoder and the column decoder.

In accordance with another embodiment of the present invention, a memory module includes a transistor including a gate and a gate junction region; a storage unit coupled to the gate junction region; a memory device including a semiconductor cell array, a row decoder, a column decoder, and a sense amplifier; and an external input/output (I/O) line. The semiconductor cell array includes a contact part formed at both sides of a line pattern whose center part includes a device isolation film and configured to include an oxide film formed over the line pattern, and a bit line formed at a bottom part between the line patterns and coupled to the contact part.

The memory device may further include a data input buffer, a command/address input buffer, and a resistor.

The external input/output (I/O) line may be electrically coupled to the memory device.

In accordance with another embodiment of the present invention, a memory system includes a transistor including a gate and a gate junction region; a storage unit coupled to the gate junction region; a plurality of memory modules, each of which includes a memory device including a memory cell array, a row decoder, a column decoder, and a sense amplifier, and also includes a command link and a data link; and a memory controller for transmitting/receiving data and command/address signals to and from the memory module. The memory cell array includes a contact part formed at both sides of a line pattern whose center part includes a device isolation film and configured to include an oxide film formed over the line pattern, and a bit line formed at a bottom part between the line patterns and coupled to the contact part.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
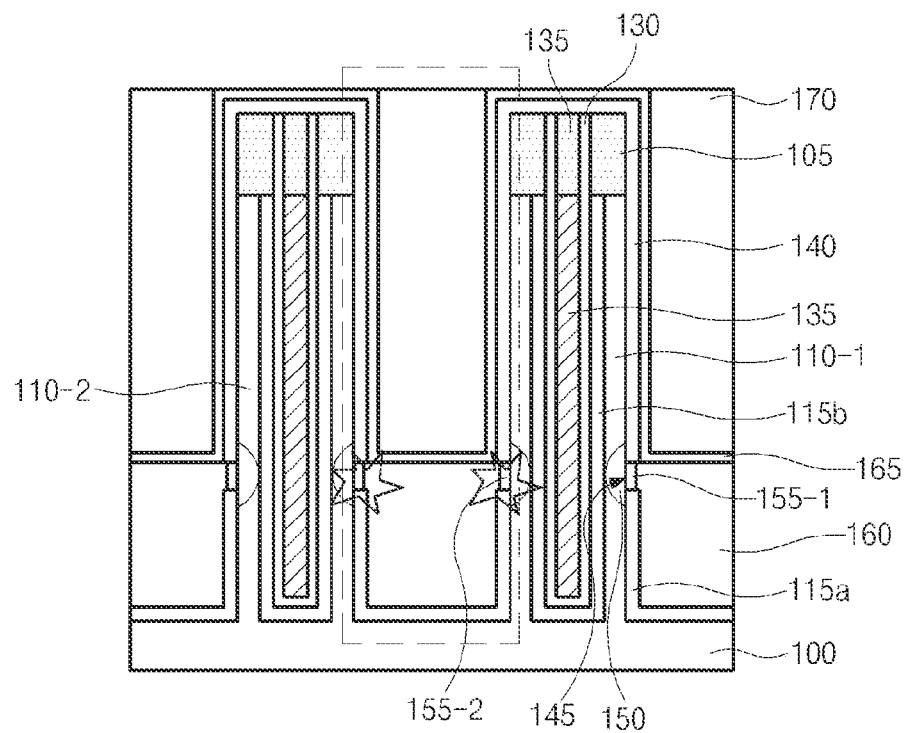
FIG. 1 is a cross-sectional view illustrating a semiconductor device according to an embodiment of the present invention.

FIG. 1 is a cross-sectional view illustrating a semiconductor device according to an embodiment of the present invention, Referring to FIG. 1 and FIGS. 2, the semiconductor device according to the present invention includes a line pattern 110 formed over a semiconductor substrate 100, and a device-isolation insulation film 135 formed at the center part of the line pattern 110. The line pattern 110 is formed by etching the semiconductor substrate 100. The device-isolation insulation film 135 is formed to divide one line pattern 110 into two parts.

In addition, a sidewall contact 145 is formed at both sides of the line pattern 110. Since the line pattern 110 is divided into two parts, one sidewall contact 145 is formed at each one of the both sides of the line pattern 110. This sidewall contact 145 is used as a rupture part of the anti-fuse. The buried bit line 160 coupled to the sidewall contact 145 is formed at the bottom part disposed between the line patterns 110. The buried bit line 160 may include a doped polysilicon layer.

In addition, a non-conductive barrier film 155 is formed between the line pattern 110 exposed by the sidewall contact 145 and the bit line 160. Preferably, the non-conductive barrier film 155 may be formed to have a thickness of 20 Å to 25 Å. In this case, the non-conductive barrier film 155 serves as an insulation film ruptured by a voltage received from the anti-fuse.

The embodiment of the present invention provides the anti-fuse, in which the non-conductive barrier film 155 located at the contact part between the bit line 160 and the line pattern 110 is ruptured by a bias voltage applied to the bit line 160 and the junction region 150. As a result, the non-conductive barrier film 155 is easily ruptured only in the overlapping region of the bit line 160 and the junction region 150, thereby resulting in increase in reliability and stability of the semiconductor device.

A method for manufacturing a semiconductor device according to one embodiment of the present invention will hereinafter be described with reference to FIGS. 2A to 2I. FIGS. 2A to 2I are cross-sectional views illustrating a method for manufacturing a semiconductor device according to an embodiment of the present invention.

Figure 2A:
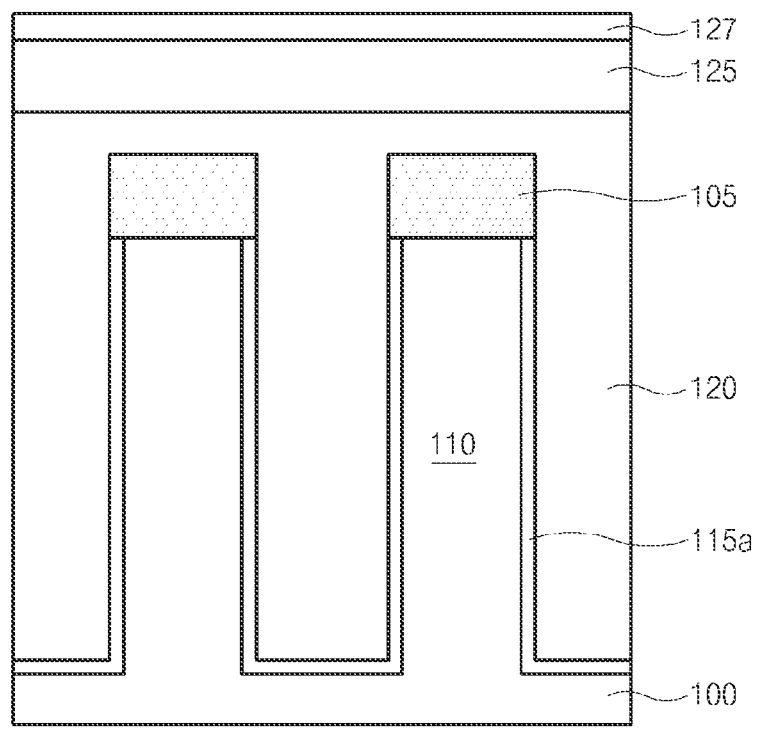
FIGS. 2A to 2I are cross-sectional views illustrating a method for manufacturing a semiconductor device according to an embodiment of the present invention.
Figure 2B:
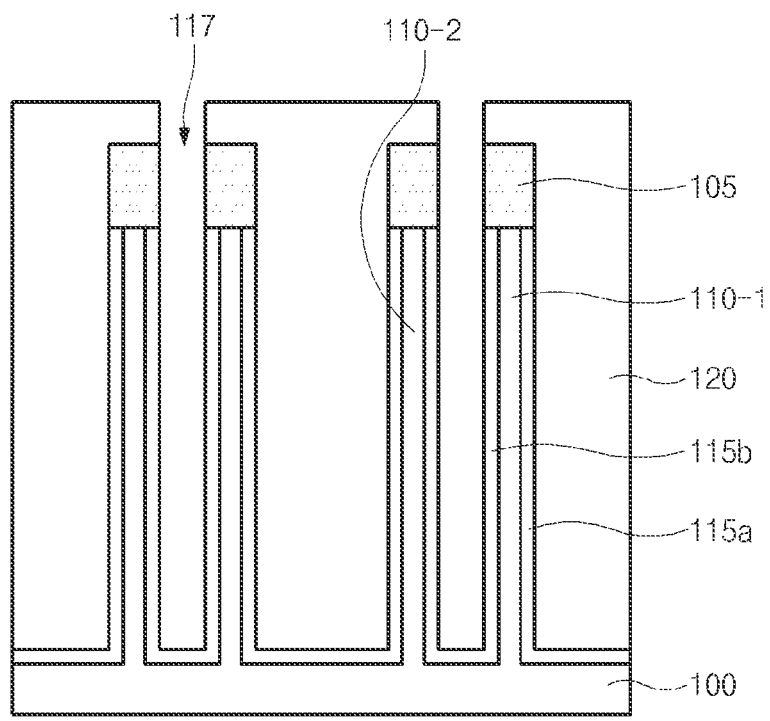
Figure 2C:
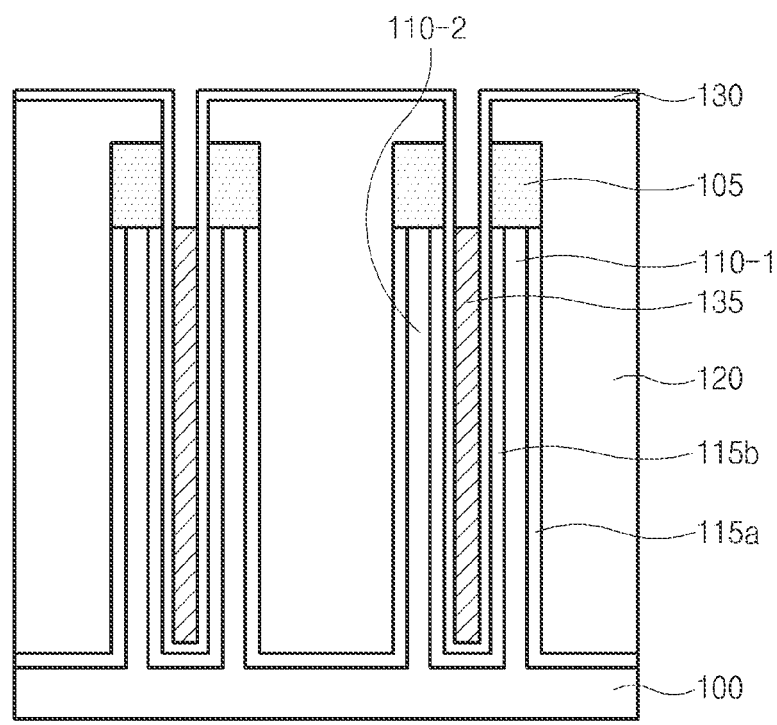
Figure 2D:
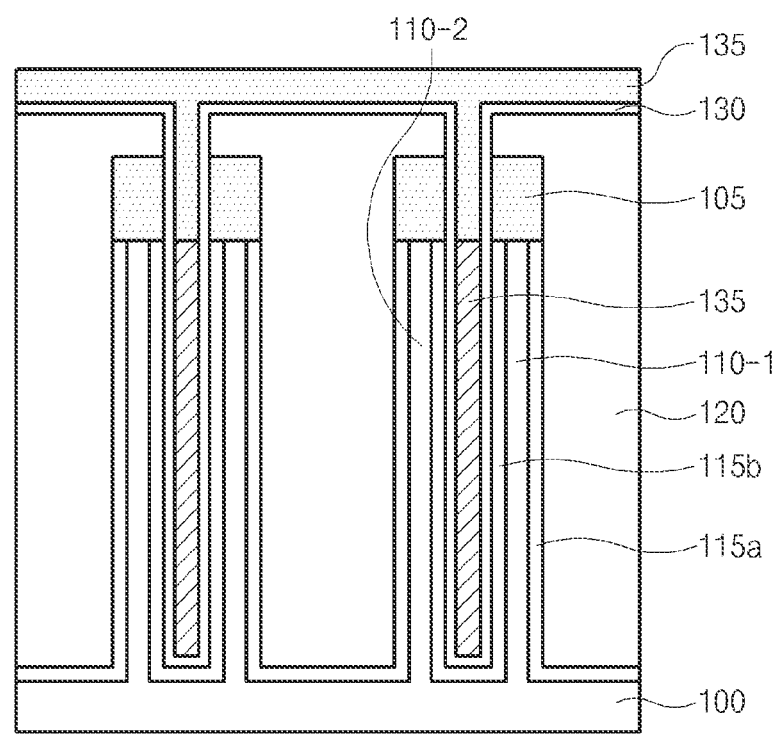
Figure 2E:
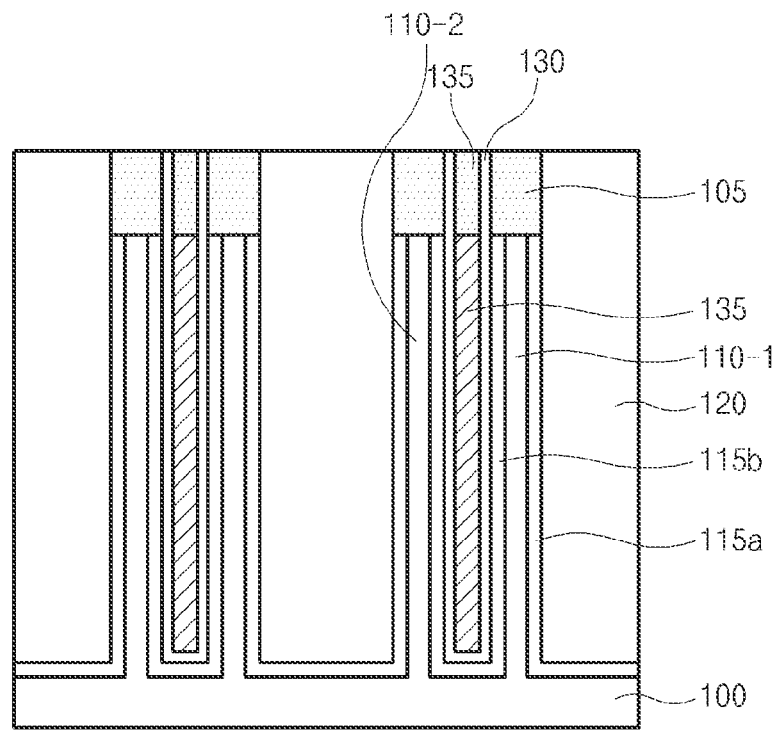
Figure 2F:
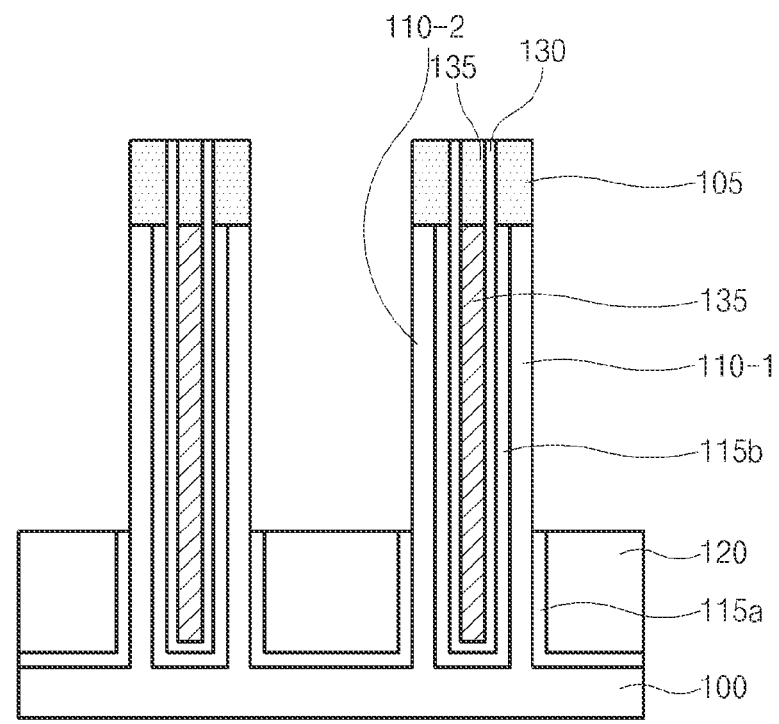
Figure 2G:
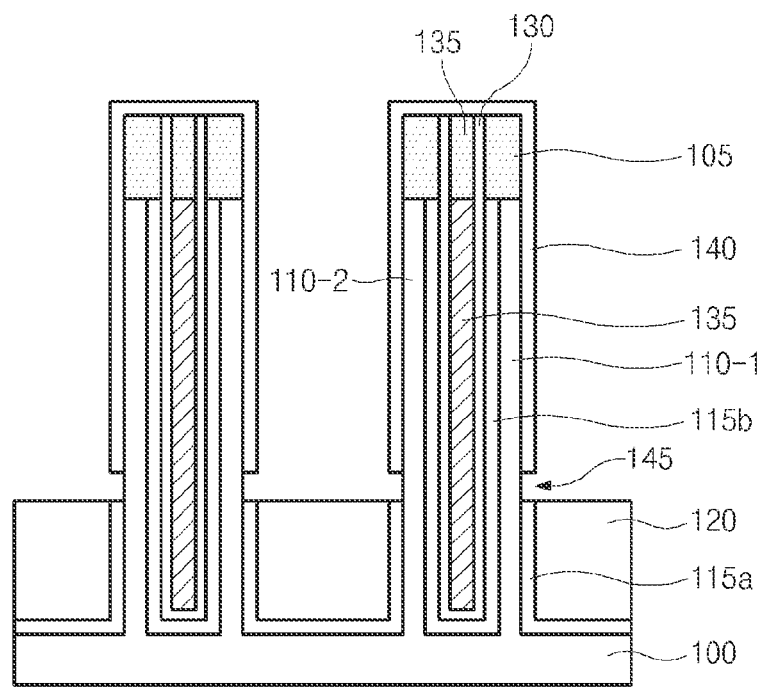
Figure 2H:
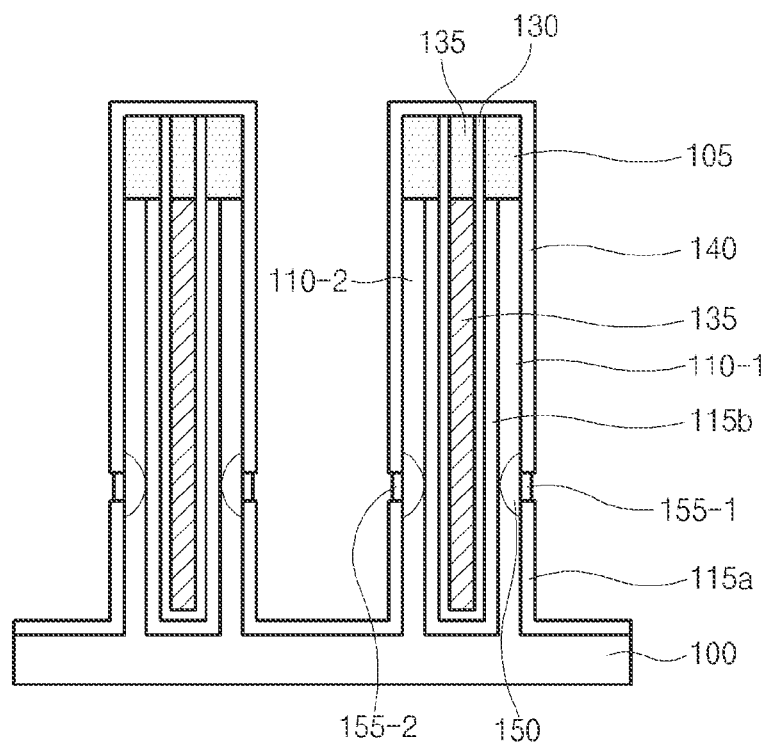
Figure 2I:
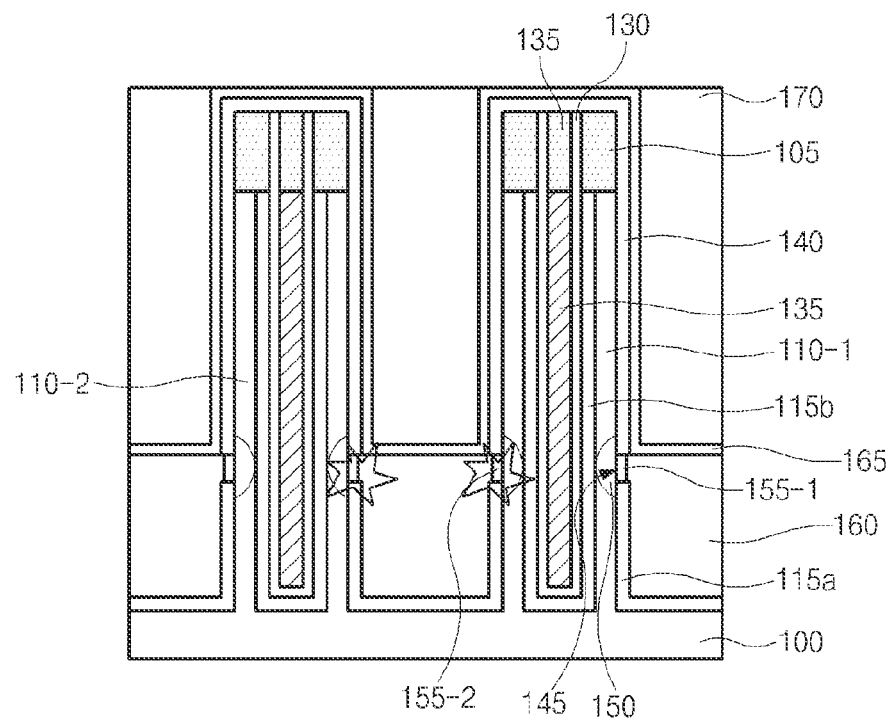

As shown in FIGS. 1 and 2I, a semiconductor device according to an embodiment of the present invention includes a vertical anti-fuse serving as a redundancy cell. The vertical anti-fuse includes a first pillar (110-1) extending from a substrate, a junction (150) formed in the first pillar (110-1), a non-conductive barrier film (155) formed over a first sidewall of the first pillar (110-1) to be coupled to the junction (150), and a bit line (160) coupled to the non-conductive barrier film (155).

The vertical anti-fuse may also serve as a default normal cell, rather than a redundancy cell.

The non-conductive barrier film (155) is configured to rupture when a given electrical bias is applied across the non-conductive barrier film (155). The given electrical bias is applied across the non-conductive barrier film (155) through the bit line (160).

The vertical anti-fuse also includes a device isolation pattern (135) formed over a second sidewall of the first pillar (110-1) with such a thickness as to prevent the given electrical bias from rupturing a second non-conductive barrier film (155-2) of a neighboring vertical anti-fuse. The vertical anti-fuse and the neighboring vertical anti-fuse are configured symmetrical to each other with respect to the device isolation pattern (135).

A semiconductor device according to an embodiment of the present invention may be formed as follows.

A line pattern (110) extending from a substrate (100) is formed. See FIG. 2A. A device isolation pattern (135) is formed in the middle of the line pattern(110) to form first and second pillars (110-1, 110-2) separated by the device isolation pattern (135). See FIGS. 2B-2E. A junction (150) is formed in the line pattern (110). See FIG. 2H Then, a non-conductive barrier film (155) is formed over a first sidewall of the first pillar (110-1) to be coupled to the junction (150). See FIG. 2H. A bit line (160) coupled to the non-conductive barrier film (155) is formed. See FIG. 2I.

The non-conductive barrier film (155) is configured to rupture when a given electrical bias is applied across the non-conductive barrier film (155) through the bit line (160).

When the line pattern (110) has a first width, and the first pillar (110-1) has a second width, the second width may be approximately one-third of the first width.

A method for repairing a semiconductor device according to an embodiment of the present invention may be performed by applying the given electrical bias across the non-conductive barrier film (155) to rupture the non-conductive barrier film (155) of the semiconductor device shown in FIG. 2I.

Hereinafter, the present invention will be described in more detail in reference to FIGS. 2A-2I.

Referring to FIG. 2A, a hard mask pattern 105 is formed over the semiconductor substrate 100, and the semiconductor substrate 100 is etched using the hard mask pattern 105 as an etch mask, resulting in formation of a line pattern 110. A first liner oxide film 115a is formed over the line pattern 110A buried polysilicon layer 120 is formed over the entire surface of the semiconductor substrate 100 including the line pattern 110.

A hard mask layer 125 and a reflection prevention film 127 are formed over the buried polysilicon layer 120. The hard mask layer 125 may be formed of amorphous carbon. The reflection prevention film 126 may be formed of silicon oxide nitride film (SiON).

Referring to FIG. 2B, a photoresist pattern (not shown) configured to open the center part of the line pattern 110, is formed over the reflection prevention film 127 The reflection prevention film 127 and the hard mask layer 125 are then etched using the photoresist pattern (not shown) as an etch mask.

After removing the photoresist pattern (not shown), the buried polysilicon layer 120, the hard mask pattern 105 and the line pattern 110 are etched using the etched reflection prevention film 127 and the etched hard mask layer 125 as an etch mask, so that a device-isolation trench 117 is formed. The line pattern 110 is divided into first and second line patterns 110-1, 110-2. Thereafter, the reflection prevention film 127 and the hard mask layer 125 are removed.

An oxidation process is performed to form a second liner oxide film 115b over the first and the second line pattern (110-1, 110-2) exposed by the device-isolation trench 117. A cleaning process is then performed.

Referring to FIG. 2C, a first liner nitride film 130 is formed over the surface of the semiconductor substrate 100, including the device-isolation trench 117. A device-isolation insulation film 135 is formed over the semiconductor substrate 100 including the first liner nitride film 130. The device-isolation insulation film 135 may be formed of an oxide film, preferably, a spin-on dielectric (SOD) oxide film.

The device-isolation insulation film 135 is partially etched to remain in the device-isolation trench 117. In this case, the height of the etched device-isolation insulation film 135 may be determined on the basis of the top part of the first and second line pattern (110-1, 110-2). That is, the device-isolation insulation film 135 is as high as the line pattern 110.

Referring to FIG. 2D, a capping film 135 is formed over the device-isolation insulation film 135 and the first liner nitride film 130. The capping film 135 is formed to within the top part of the trench 117. The capping film 135 may comprise a material including a nitride film.

Referring to FIG. 2E, the capping film 135, the first liner nitride film 130, and the buried polysilicon layer 120 are etched by the planarization process, so that the hard mask pattern 105 is exposed.

Referring to FIG. 2F, the buried polysilicon layer 120 between the line pattern 110 is etched by the etchback process. The etched buried polysilicon layer 120 remains only in the bottom part between the line patterns 110. Thereafter, the cleaning process is carried out.

Referring to FIG. 2G, a second liner nitride film 140 is formed not only over the line pattern 110 exposed by the buried polysilicon layer 120, but also over the hard mask pattern 105. Thereafter, the buried polysilicon layer 120 and the first liner oxide film 115a are further etched partially to form a sidewall contact 145 exposing the line pattern (110).

The sidewall contact 145 is used as a rupture part of the anti-fuse. Since one line pattern 110 is divided into two parts, two sidewall contacts 145 are formed at one line pattern 110.

Referring to FIG. 2H, n-type impurity ions are implanted into the line pattern 110 through the sidewall contact 145, resulting in formation of the junction region 150. Impurity ion implantation for forming a junction region 150 may be performed by a plasma doping (PLAD) process.

Thereafter, the non-conductive barrier film 155 is formed over the line pattern 110 exposed by the sidewall contact 145. The non-conductive barrier film 155 may be formed of an oxide film. Preferably, the oxide film may be formed to have a thickness of between about 20 Å to 25 Å. In this case, the non-conductive barrier film 155 may be used as an anti-fuse barrier film which is supposed to rupture by a voltage or current bias applied across the anti-fuse. Thereafter, the buried polysilicon layer 120 is removed.

Referring to FIG. 2I, a doped polysilicon layer is formed over the entire surface of the semiconductor substrate 100 including the line pattern 110. The doped polysilicon layer is etched by the etchback process, so that the doped polysilicon layer remains only in the bottom part between the line patterns 110, resulting in formation of the buried bit line 160. In this case, the buried bit line 160 may be preferably formed to the height of the top part of the sidewall contact 145. The second liner nitride film 165 is formed over the buried bit line 160 and the first liner nitride film 140.

Thereafter, the insulation film 170 is formed over the surface of the semiconductor substrate 100 including the second liner nitride film 165. The insulation film 170 is etched until the second liner nitride film 165 formed over the hard mask pattern 105 is exposed. Although not shown in the drawings, a vertical gate may be additionally formed in a subsequent process.

The embodiment of the method provides the anti-fuse in which the non-conductive barrier film 155 located between the doped polysilicon layer 160 and the line pattern 110, is ruptured by a bias voltage applied across the non-conductive barrier film 155 due to a bias difference between the junction region 150 (or the first semiconductor pillar 110-1) and the bit line 160.

The device isolation pattern (135) prevents the bias voltage applied from influencing another junction region 150 (or a semiconductor pillar 110-2) of a neighboring pillar anti-fuse. As a result, the non-conductive barrier film 155 is easily ruptured only at an interface between the bit line 160 and the junction region 150, while keeping the second oxide film 155-2 intact.

This increases reliability and stability of the semiconductor device. Although the non-conductive barrier film 155 formed at the first line pattern 110-1 is ruptured and forms a closed circuit, integrity of the second oxide film 155-2 of the second line pattern 110-2 can be maintained and forms an opened circuit.

Figure 3:
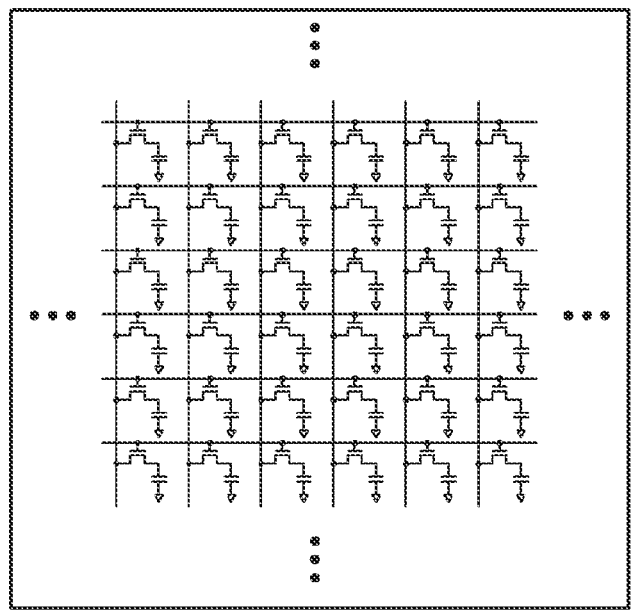
FIG. 3 is a block diagram illustrating a cell array according to an embodiment of the present invention.

FIG. 3 is a block diagram illustrating a cell array according to an embodiment of the present invention.

Referring to FIG. 3, the cell array includes a plurality of memory cells, and each memory cell includes one transistor and one capacitor. Such memory cells are located at intersections of bit lines BL1~BLn and word lines WL1~WLm. The memory cells may store or output data in response to a voltage applied to any bit line (BL1, ..., BLn) or any word line (WL1, ..., WLm) selected by a column decoder and a row decoder.

In the semiconductor cell array shown in FIG. 3, a first direction (i.e., a bit-line direction) of the bit lines (BL1, ..., BLn) of the cell array is the longitudinal direction, and a second direction (i.e., a word-line direction) of the word lines (WL1, ..., WLm) is the longitudinal direction, such that the bit lines (BL1, ..., BLn) cross the word lines (WL1, ..., WLm). A first terminal (for example, a drain terminal) of a transistor is coupled to the bit lines (BL1, ..., BLn), a second terminal (for example, a source terminal) thereof is coupled to a capacitor, and a third terminal thereof (for example, a gate terminal) is coupled to the word lines (WL1, ..., WLm). A plurality of memory cells including the bit lines (BL1, ..., BLn) and the word lines (WL1, ..., WLm) may be located in a semiconductor cell array.

In this case, the bit line is formed as shown in FIG. 1, and provides the anti-fuse in which the non-conductive barrier film 155 formed at the contact part between the bit line 160 and the line pattern 110 is ruptured by a bias voltage applied to the bit line 160 and the junction region 150.

As described above, the semiconductor cell array according to the present invention can easily rupture the non-conductive barrier film 155 located at the overlapping region of the bit line 160 and the junction region 150, resulting in increase in reliability and stability of the semiconductor device.

Figure 4:
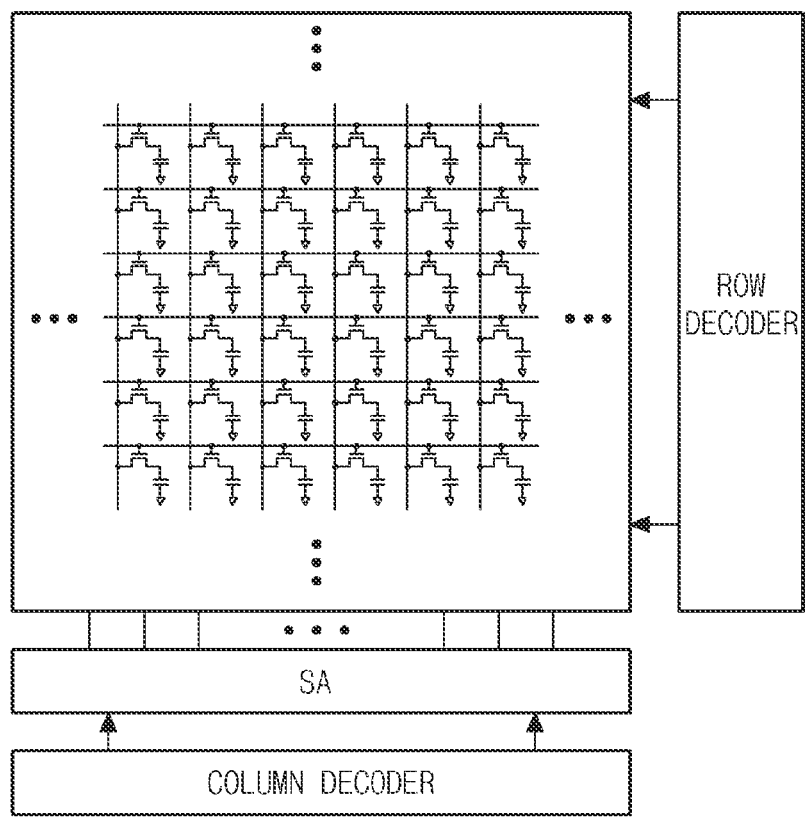
FIG. 4 is a block diagram illustrating a semiconductor device according to an embodiment of the present invention.

FIG. 4 is a block diagram illustrating a semiconductor device according to the present invention.

Referring to FIG. 4, the semiconductor device may include a cell array, a row decoder, a column decoder, and a sense amplifier (SA). The row decoder selects a word line corresponding to a memory cell in which a read or write operation is to be performed from among a plurality of word lines of the semiconductor cell array, and outputs a word-line selection signal (RS) to the semiconductor cell array. In addition, the column decoder selects a bit line corresponding to a memory cell in which a read or write operation is to be performed from among a plurality of bit lines of the semiconductor cell array, and outputs a bit-line selection signal (CS) to the semiconductor cell array. In addition, the sense-amplifier (SA) may sense data (BDS) stored in a memory cell selected by the row decoder and column decoder.

In this case, the bit line is formed as shown in FIG. 1, and provides the anti-fuse in which the non-conductive barrier film 155 formed at the contact part between the bit line 160 and the line pattern 110 is ruptured by a bias voltage applied to the bit line 160 and the junction region 150.

As described above, the semiconductor cell array according to the present invention can easily rupture the non-conductive barrier film 155 located at the overlapping region of the bit line 160 and the junction region 150, resulting in increase in reliability and stability of the semiconductor device.

Figure 5:
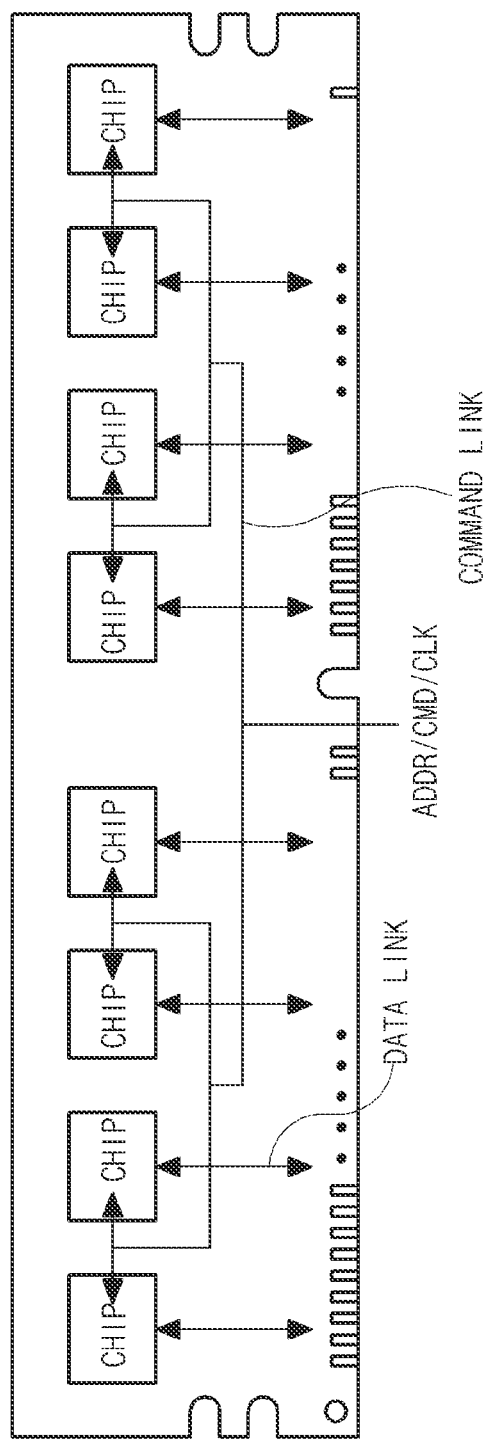
FIG. 5 is a block diagram illustrating a semiconductor module according to an embodiment of the present invention.

FIG. 5 is a block diagram illustrating a semiconductor module according to the present invention.

Referring to FIG. 5, a semiconductor module includes a plurality of semiconductor devices (CHIPs) mounted to a module substrate, a command link allowing each semiconductor device to receive a control signal (address signal (ADDR)), a command signal (CMD), and a clock signal (CLK) from an external controller (not shown), and a data link coupled to a semiconductor device so as to transmit data.

In addition, the command link and the data link may be formed to be identical or similar to those of general semiconductor modules.

Although eight semiconductor chips are mounted to the front surface of the module substrate as shown in FIG. 5, it should be noted that the semiconductor chips can also be mounted to the back surface of the module substrate. That is, the semiconductor chips can be mounted to one side or both sides of the module substrate, and the number of mounted semiconductor chips is not limited to the example of FIG. 5. In addition, a material or structure of the module substrate is not limited to those of FIG. 5, and the module substrate may also be formed of other materials or structures.

In this case, the bit line is formed as shown in FIG. 1, and provides the anti-fuse in which the nonconductive barrier film 155 formed at the contact part between the bit line 160 and the line pattern 110 is ruptured by a bias voltage applied to the bit line 160 and the junction region 150.

As described above, the semiconductor cell array according to the present invention can easily rupture the non-conductive barrier film 155 located at the overlapping region of the bit line 160 and the junction region 150, resulting in increase in reliability and stability of the semiconductor device.

Figure 6:
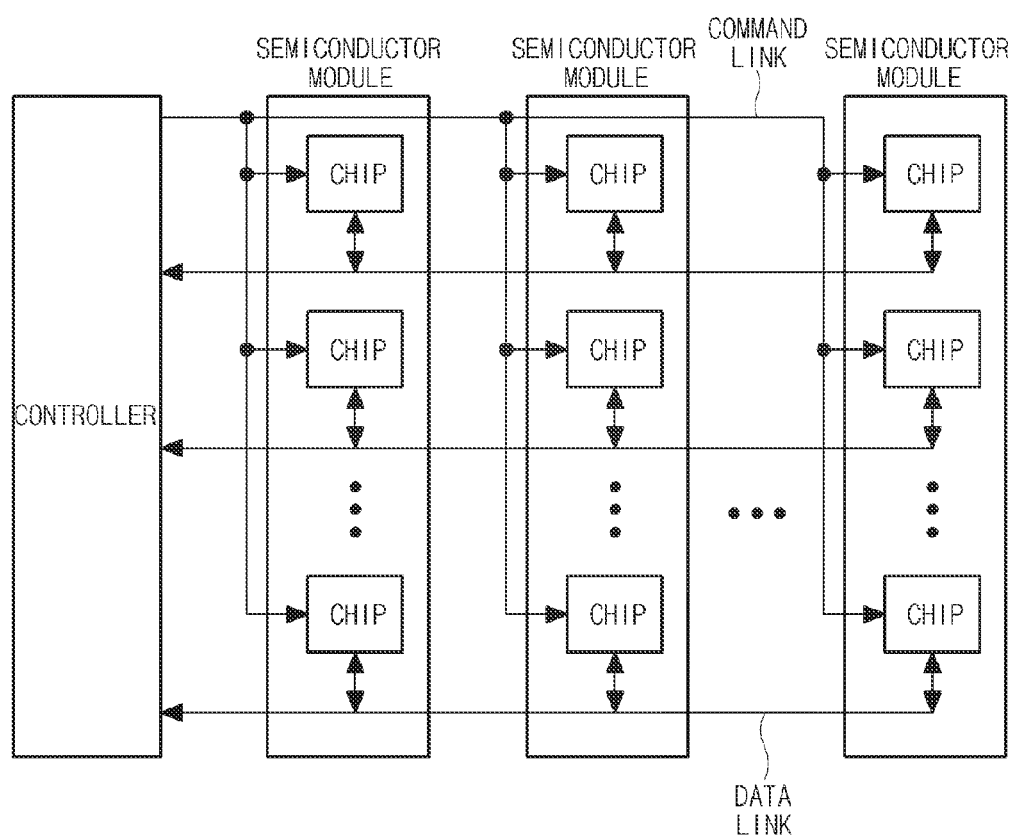
FIG. 6 is a block diagram illustrating a semiconductor system according to an embodiment of the present invention.

FIG. 6 is a block diagram illustrating a semiconductor system according to the present invention.

Referring to FIG. 6, the semiconductor system includes a semiconductor module including one or more semiconductor devices (CHIPs), and a controller for transmitting/receiving data and command/address signals through the semiconductor module and a system bus.

In this case, the bit line formed in the semiconductor device of the semiconductor system is formed as shown in FIG. 1, and provides the anti-fuse in which the non-conductive barrier film 155 formed at the contact part between the bit line 160 and the line pattern 110 is ruptured by a bias voltage applied to the bit line 160 and the junction region 150.

As described above, the semiconductor cell array according to the present invention can easily rupture the non-conductive barrier film 155 located at the overlapping region of the bit line 160 and the junction region 150, resulting in increase in reliability and stability of the semiconductor device.

Although the semiconductor device according to embodiments of the present invention can be applied to a Dynamic Random Access Memory (DRAM), a flash memory, a Ferro-electric Random Access Memory (FeRAM), a Magnetic Random Access Memory (MRAM), a Phase Change Random Access Memory (PCRAM), etc.

The principal product groups of the above-mentioned semiconductor device may be applied to a variety of computing memories for use in a desktop, a laptop, and a server, as well as to various specifications of graphic memories, and may also be applied to mobile memories being recently spotlighted with development of mobile communication technologies.

The semiconductor device is applicable not only to a variety of portable storage media (for example, a memory stick, a multimedia card (MMC), a secure digital (SD) card, a compact flash (CF) card, an eXtreme Digital (XD) card, a universal serial bus (USB) flash drive, etc.), but also to a variety of digital applications (for example, MP3 players, PMPs, digital cameras, camcorders, memory cards, USB, game machines, navigation devices, laptops, desktop computers, mobile phones, and the like). In addition, the semiconductor device may also be applied to a Multi-Chip Package (MCP), a Disk on Chip (DOC), an embedded device, etc. Also, the semiconductor device may also be applied to a CMOS Image Sensor (CIS), such that it can be provided to a variety of technical fields, for example, camera phones, Web cameras, small-sized medical imaging devices, etc.

As is apparent from the above description, the semiconductor device and the method for manufacturing the same according to the embodiments of the present invention may exhibit one or more desirable properties.

First, the anti-fuse according to embodiments of the present invention may be formed in a buried bit line including a vertical gate structure, so that the area occupied by the anti-fuse is smaller than that of the planar-gate-type anti-fuse.

Second, the anti-fuse according to embodiments of the present invention may be implemented using a sidewall contact of the buried bit line, such that breakdown (or rupture) efficiency of the insulation film is increased, resulting in increased in reliability and stability of the semiconductor device.

Third, a device isolation region may be formed at the center part of the line pattern so that the junction region is isolated. This allows the semiconductor device including the device isolation film, to possibly serve as an independent device.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A semiconductor device comprising a vertical anti-fuse, the vertical anti-fuse comprising:
 a first pillar extending from a substrate;
 a junction formed in the first pillar;
 a non-conductive barrier film formed over a first sidewall of the first pillar to be coupled to the junction;
 a bit line coupled to the non-conductive barrier film; and
 wherein the non-conductive barrier film is configured to rupture when a given electrical bias is applied across the non-conductive barrier film.

2. The semiconductor device of claim 1,
 wherein the given electrical bias is applied across the non-conductive barrier film through the bit line.

3. The semiconductor device of claim 1,
 wherein the vertical anti-fuse configures a redundancy cell.

4. The semiconductor device of claim 1,
 wherein the vertical anti-fuse further comprises a device isolation pattern formed over a second sidewall of the first pillar with a thickness to prevent the given electrical bias from rupturing a second non-conductive barrier film of a neighboring vertical anti-fuse.

5. The semiconductor device of claim 4,
 wherein the vertical anti-fuse and the neighboring vertical anti-fuse are configured symmetrical to each other with respect to the device isolation pattern.

\* \* \* \* \*